(12) United States Patent
Beyne et al.

(10) Patent No.: US 7,566,634 B2
(45) Date of Patent: Jul. 28, 2009

(54) METHOD FOR CHIP SINGULATION (75) Inventors: Eric Beyne, Leuven (BE); Bart Swinnen, Holsbeek (BE); Serge Vanhaelemeersch, Leuven (BE)

(73) Assignee: Interuniversitair Microelektronica Centrum (IMEC) (BE)

( * ) Notice: Subject to any disclaimer, the term of this patent is extended or adjusted under 35 U.S.C. 154(b) by 321 days.

(21) Appl. No.: 11/234,835

(22) Filed: Sep. 23, 2005

(65) Prior Publication Data

US 2006/0068567 A1   Mar. 30, 2006

Related U.S. Application Data (60) Provisional application No. 60/612,915, filed on Sep. 24, 2004.

(30) Foreign Application Priority Data

Dec. 9, 2004   (EP)   ................................. 04447271

(51) Int. Cl.
*H01L 21/00* (2006.01)
(52) U.S. Cl. .............................. 438/462; 257/E21.238; 257/E21.599
(58) Field of Classification Search ................ 257/620, 257/527, 594, 618, 622, E21.596, E21.599, 257/E21.238; 438/68, 113, 114, 458, 460–465, 438/33, 107
See application file for complete search history.

(56) References Cited

U.S. PATENT DOCUMENTS

| | | | |
|---|---|---|---|
| 5,434,094 A | 7/1995 | Kobiki et al. | |
| 5,597,766 A | 1/1997 | Neppl et al. | |
| 5,854,141 A * | 12/1998 | Cronin et al. | 438/763 |
| 5,925,924 A | 7/1999 | Cronin et al. | |

(Continued)

FOREIGN PATENT DOCUMENTS

DE   15 14 928 A1   8/1969

(Continued)

OTHER PUBLICATIONS

Landesberger C et al. Mar. 2001. *New dicing and thinning conecpt improves mechanical reliability of ultra thin silicon*, 2001 Inter. Symposium on Advanced Packaging Materials, pp. 92-97, Piscataway, NJ, USA, IEEE.

(Continued)

*Primary Examiner*—W. David Coleman
*Assistant Examiner*—Sonya D McCall-Shepard
(74) *Attorney, Agent, or Firm*—Knobbe Martens Olson & Bear LLP (57) ABSTRACT

The present invention is related to a method for singulating chips from a stack of layers, such as the layers on a wafer or substrate. The stack of layers includes a front end of line (FEOL) layer upon the substrate layer, with the substrate layer having a first surface and a second surface. The FEOL is positioned on top of the first surface, and a back end of line (BEOL) layer is positioned on top of the FEOL. The method includes etching singulating trenches through the BEOL, through the FEOL and at least partially through the substrate layer, depositing a passivation layer on the stack provided with singulating trenches, whereby the sidewalls of the etched singulating trenches are at least partially passivated. Dicing, such as blade dicing, laser dicing or trench etch dicing is performed, releasing the chip from the stack of layers.

30 Claims, 6 Drawing Sheets

U.S. PATENT DOCUMENTS

| | | | |
|---|---|---|---|
| 6,174,789 B1 * | 1/2001 | Tsukada | 438/462 |
| 6,214,745 B1 | 4/2001 | Yang et al. | |
| 6,908,784 B1 * | 6/2005 | Farnworth et al. | 438/106 |
| 2002/0042189 A1 | 4/2002 | Tanaka | |
| 2004/0130001 A1 * | 7/2004 | Headley et al. | 257/620 |
| 2005/0196938 A1 * | 9/2005 | Tan et al. | 438/460 |

FOREIGN PATENT DOCUMENTS

JP 59003961 10/1984

OTHER PUBLICATIONS

European Search Report for Application No. EP 04 44 7271, Jun. 7, 2005.

* cited by examiner

METHOD FOR CHIP SINGULATION

CROSS-REFERENCE TO RELATED APPLICATIONS

This application claims the benefit under 35 U.S.C. § 119 (e) of U.S. Patent Application No. 60/612,915 filed Sep. 24, 2004 for "METHOD FOR CHIP SINGULATION", and claims the benefit under 35 U.S.C. § 119(a) of European Patent Application No. EP 04447271.0 filed on Dec. 9, 2004, for "METHOD FOR CHIP SINGULATION" all of which are hereby incorporated by reference.

FIELD OF THE INVENTION

The present invention relates to the field of semiconductor processing. More specifically it relates to methods for wafer dicing.

BACKGROUND OF THE TECHNOLOGY

Figure 1:
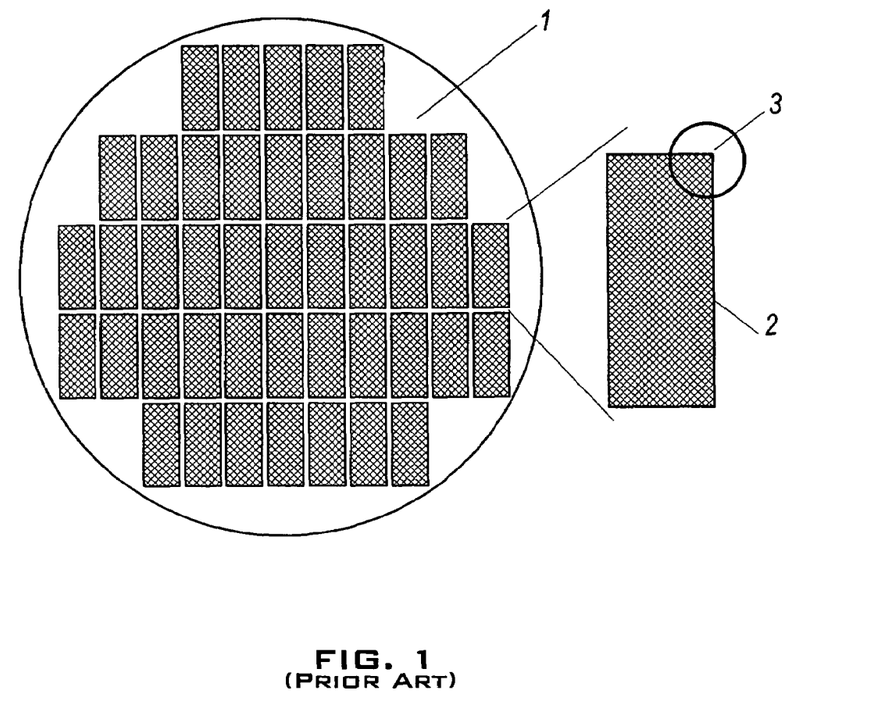
FIG. 1 illustrates a prior art solution, whereby die singulation can be achieved by blade dicing, laser cutting or trench etch dicing.
Figure 2:
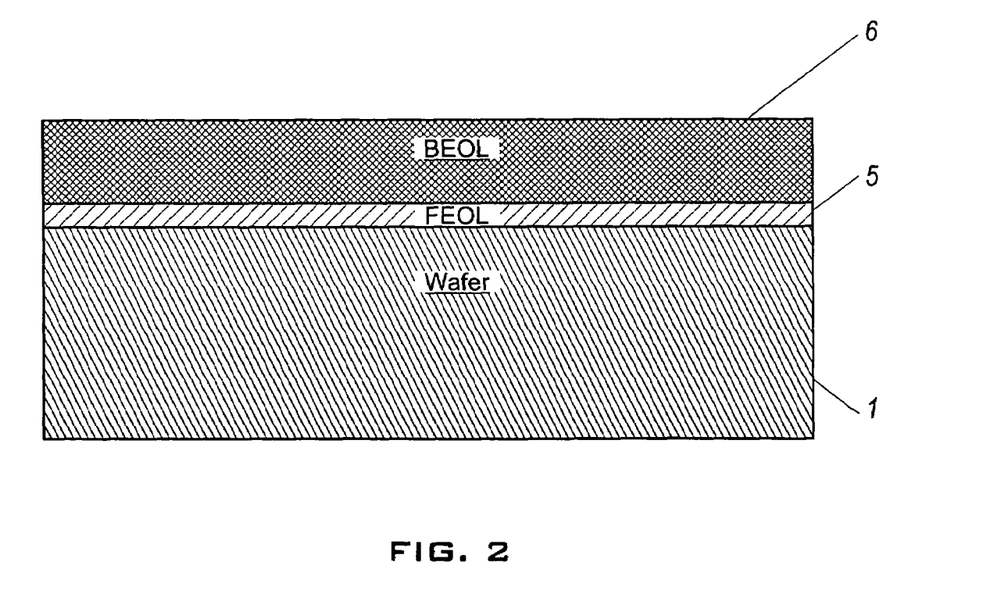
FIG. 2 to FIG. 5 illustrate an embodiment of the invention.
Figure 3:
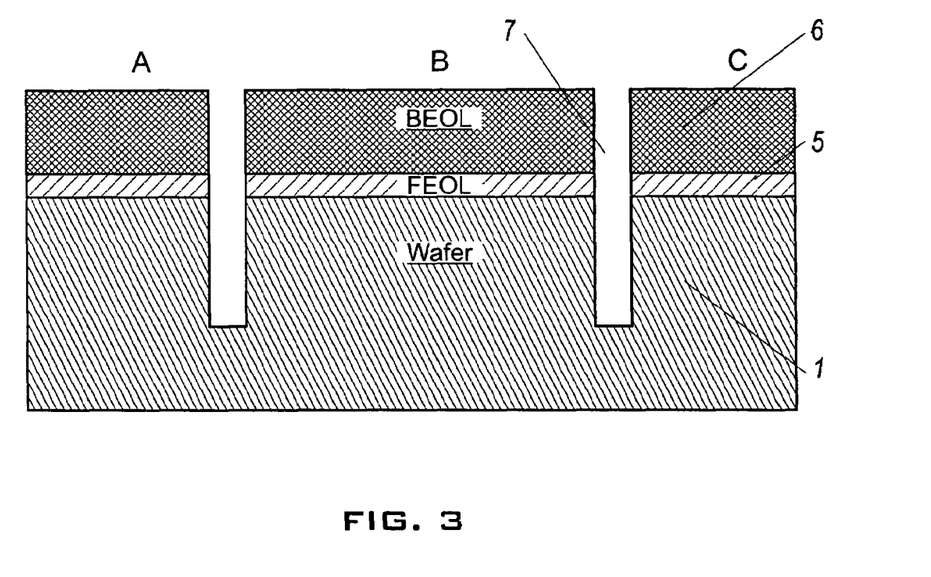
Figure 4:
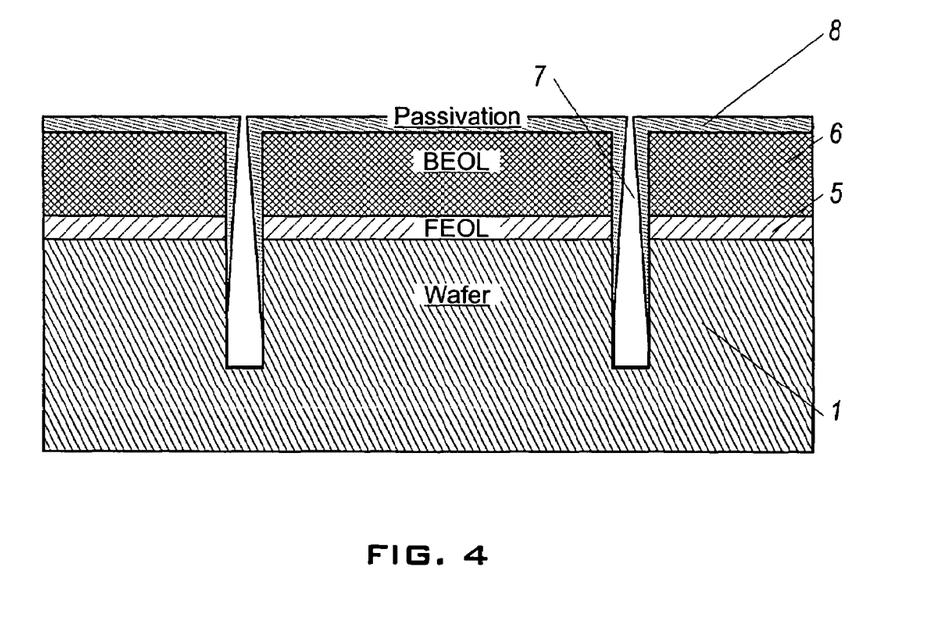

Die or chip singulation is the separation of different dies (2) on a wafer (1) (see FIG. 1). It is the first of all assembly steps.

Die singulation by means of classical blade dicing is standard practice: dies are cut with a rotating wheel while a rinsing solution is spilled over the wafer in order to remove particles induced by the saw. This method requires dicing streets with a width of several tens of micron and gives rise to considerable sidewall damage (chipping, cracking). Especially when dicing through areas that contain metal dummies, which are present in copper damascene processing, the damage caused by ripping the metal pads out of the stack during dicing may be extensive.

Laser cutting is an alternative to classical blade dicing: here applying a laser beam onto it, evaporates material in the scribe lanes. This method is not subject to chipping; however, the heat generated by the laser beam may affect the properties of the material next to the dicing street. Hence an exclusion area where no circuitry is allowed is required near the dicing streets. Even without taking the heat-affected zone into account, the dicing streets achieved in this way are between 15 and 30 micron wide. No laser dicing solution exists that can cut through a stack with dummy metal pads in the scribe lanes.

Wafers or substrates are processed until completion of deposition, patterning and polishing of the last metal level below a passivation layer. A passivation layer is commonly known as a protective layer to assure the chemical stability of the layer(s) below. Both classical blade and laser dicing are performed after completion of the full wafer including passivation stack. Depending on the assembly route, a number of wafer level processes may be performed between passivation deposition and singulation (e.g. under bump metallization (UBM)/solder plating/redistribution layer deposition).

Trench etch dicing is a known technique, for instance from Advanced Packaging Materials, Processes, Properties and Interfaces, Proceedings of IEEE 01TH8562, ISBN 0-930815-64-5, pp. 92-97. Here, after completion of the wafer back end and the passivation stack, dicing streets are imaged and subsequently etched. This process gives rise to die edges that are very well defined (no chipping or cracking).

Trench etch dicing is capable of reducing considerably the scribe lane width required for dicing. In practice, the Si-gain is often limited by the fact that scribe lanes also contain electrical test structures and alignment features, which imposes a lower limit on the scribe lane width. Whereas blade dicing and laser dicing are performed scribe-by-scribe, trench etch dicing is a true wafer level process.

In all of the above mentioned processes, die singulation is performed after passivation. Hence, in all these processes, after singulation, only the top area of the die is passivated. Die edges are not protected.

In U.S. Pat. No. 5,925,924 methods for precise definition of IC chip edges are disclosed. Trenches are etched in the wafer to define the edges. Then the trenches are filled with an insulating material, which mechanically joins the IC chips of the wafer. It should be noted that an insulating layer is not always a passivation layer, which may be necessary for certain applications. Moreover the patent describes a method for stacking different dies or ICs, which are interconnected via the side surface of the resulting stack. Different etching steps are necessary to achieve this goal, since a discontinuous isolation layer on at least one side surface of the stack is required to allow the formation of interconnects.

Patent U.S. Pat. No. 5,597,766 relates to a method for detaching chips from an SOI substrate wafer, being a wafer covered by an insulating base layer. $SiO_2$ layers are produced on the top surfaces of the dies and subsequently the complete die surface is covered with a passivation layer. Next trenches are etched between the chips down to the insulating layer of the substrate (i.e. the insulating layer serves as a stop layer for the trench etching) for separating the chips. Spacers are produced subsequently for passivation at the side-walls of the chips. Then wafer material is removed by etching from the backside in order to detach the chips.

Various aspects of the invention provide for a method for wafer dicing, which alleviates or avoids the problems of the prior art mentioned above.

SUMMARY OF CERTAIN INVENTIVE ASPECTS

Various aspects of the invention provide for a method for singulating at least one chip from a stack of layers, the stack comprising a front end of line (FEOL) upon a substrate layer, the substrate layer having a first and a second surface. The FEOL is positioned on top of the first surface. The stack further comprises a back end of line (BEOL) on top of the FEOL. The method comprises the steps of:

etching singulating trenches through the BEOL, through the FEOL and at least partially through the substrate layer of the stack, depositing a passivation layer on the stack provided with singulating trenches, such that sidewalls of the trenches are at least partially passivated, and releasing the chip from the stack of layers.

The above mentioned steps are preferably performed in the sequence as shown above.

In various embodiments, the step of releasing the at least one chip comprises reducing the thickness of the substrate layer from the second surface onwards and at least in the region between the second surface and the bottom of the singulating trenches until the chip is released from the stack.

In other various embodiments, at least two chips are singulated, and the step of etching trenches comprises etching two trenches between two neighboring chips. The step of releasing the chips then comprises a step of blade dicing, laser dicing or trench etch dicing between the two trenches. In such embodiments the area in between two such trenches can comprise metal dummies, test structures etc., which are not part of the dies or chips to be singulated. These areas may not be necessary anymore, e.g. after having performed testing, or may be of no real interest. Therefore, blade dicing within this area can be performed, or possibly also trench etch dicing or laser dicing. In the case of blade dicing the trenches have the advantage that they relax stresses and may stop the propagation of cracks or other physical damage towards the chip areas.

In other various embodiments, the BEOL is provided with metal dummies positioned outside a zone comprising the area of the chip and outside an exclusion zone around the chip area, wherein the act of etching the singulating trenches is performed.

In another embodiment, the step of etching singulating trenches is performed in back end of line processing technology.

In another embodiment the method further comprises a step of etching holes for interconnects in the chip area.

In an alternative embodiment damascene processing is performed for the BEOL.

Advantageously the step of etching singulating trenches can further comprise a step of using a mask with patterns corresponding to dies with rounded corners.

The present invention can be advantageous if the BEOL comprises moisture-sensitive material.

DETAILED DESCRIPTION OF CERTAIN INVENTIVE EMBODIMENTS

Aspects of the present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third, and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

FIG. 2 to FIG. 5 illustrate an embodiment of the invention. Note that in FIG. 3 to FIG. 5 a schematic representation is given, comprising (indicated in FIG. 3) blocks A, B, C. Corresponding to certain embodiments, all of those blocks can correspond to dies. In an embodiment wherein at least two chips are singulated and wherein two trenches are etched between each two neighboring chips, block B would not represent a chip but rather an area comprising metal dummies, test structures etc . . . These metal dummies, test structures, . . . are not part of the dies or chips (represented by blocks A and C) to be singulated. Therefore blade dicing can be performed within this area, or possibly trench etch dicing or laser dicing.

Aspects of the present invention provide a method for singulating chips from a stack of layers. The stack (see FIG. 2) is obtained by first providing a substrate layer (1) having a first and a second surface. Then, on top of the first surface the front end of line (FEOL) (5) is processed and then the back end of line (BEOL) (6) is processed on the FEOL. The front end of line is commonly known as the layers in a semiconductor stack up to a first interconnect metallization level that contain active devices. The back end of line is commonly known as the layers in a semiconductor stack following the first metallization level and before the passivation layer(s).

The method comprises the following steps:

etching singulating trenches (7), going through the BEOL, through the FEOL and at least partially through into the substrate (FIG. 3), depositing a passivation layer (8) on the stack, now provided with singulating trenches (7), thereby passivating the upper surfaces of the chips to be singulated as well as the sidewalls of the singulating trenches that in a later stage will constitute the side surfaces of the chips (FIG. 4), releasing at least one chip from the stack of layers.

Figure 5:
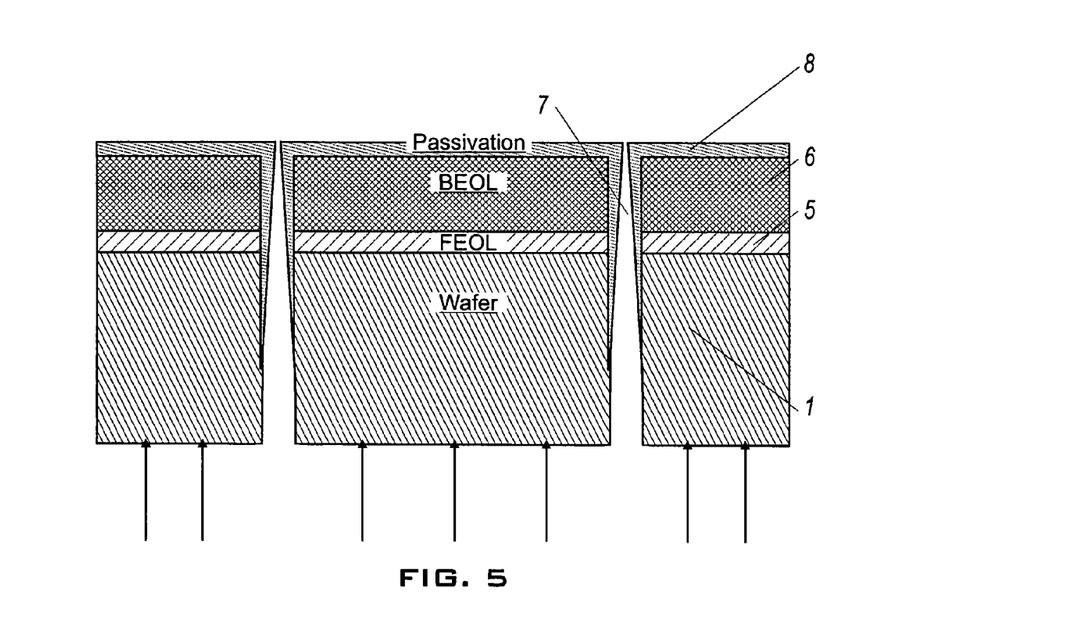

In a certain embodiment, the step of releasing at least one chip comprises reducing the thickness of the substrate layer from the second surface onwards (that is, from the bottom side of the stack) at least in the region between the second surface and the bottom of the singulating trenches, until the individual chips are released (FIG. 5).

In another embodiment at least two chips are singulated, and the step of etching trenches comprises etching two trenches between each two neighboring chips. The step of releasing the chips then comprises a step of blade dicing, laser dicing or trench etch dicing between the two trenches. In such embodiment the area between two such trenches can comprise metal dummies, test structures etc., which are not part of the dies or chips to be singulated. These areas may not be necessary after having performed testing or may be of no real interest. Therefore blade dicing within this area can be performed, or, if possible, trench etch dicing or laser dicing. In the case of blade dicing the trenches have the advantage that they relax stresses and may stop the propagation of cracks or other physical damage towards the chip areas.

An advantage of the present invention is the presence of a step of depositing one or more passivation layers (8) on top of the stack after having provided singulating trenches. Thereby passivating the upper surface or top of the stack comprising a chip to be singulated as well as the sidewalls or side surfaces of the chip. Thereby the sidewalls of the BEOL and the FEOL can be passivated. In the prior art, the singulation process is performed completely after passivation, resulting in unpassivated sidewalls. A passivation layer is commonly known as a protective layer, above the BEOL, that assures the chemical stability of the layers below.

The passivation material is application dependent and can comprise, for instance SiC, Silicon dioxide, Silicon Nitride, SiON, BenzoCycloButene (BCB) or a combination of these or other materials. The passivation layer can comprise different sublayers, made out of different materials. For instance the passivation layer can be a tri-layer. It can be for instance a $SiC/SiO_2/SiN_4$ layer as for instance about 50 nm SiC/330 nm $SiO_2$/500 nm $SiN_4$ for a copper process. For an Aluminium process it can be for instance a $SiN_4$ layer. The required minimum thickness depends on the sensitivity to contamination of the underlying chip.

The passivation layer can be deposited by state of the art techniques as Physical Vapor Deposition (PVD) or Chemical Vapor deposition (CVD). Some materials (e.g. BCB) can be spun on.

This aspect of the present invention enhances the reliability of dies that incorporate moisture sensitive materials such as, but not only, low-K dielectrics and may eliminate the need for space consuming sealing rings (often referred to as a 'guard rings' or 'walls') around the die active area, as shown in prior art.

An additional step of typically, temporarily attaching the stack of layers comprising singulation trenches, to an adhesive film or foil before releasing the individual chips can be performed in another preferred embodiment.

The substrate can essentially be any substrate, which allows etching narrow trenches (about 1, 2, 3, 4, 5, 10, 15, 20 μm wide for instance). It can be any semiconductor substrate, for instance, but not limited to, a silicon substrate, a gallium arsenide (GaAs) substrate or a Germanium substrate. The active layer is a layer at the top of the substrate (or on top of the substrate depending on the view), for instance Si substrate, or on top of the buried oxide in Silicon on Insulator (SOI) substrates in which transistors are built. Below the active layer, the substrate (e.g. Si substrate) is present to provide mechanical support. The trenches should be deeper than the combined thickness of chip and active layer thickness in the substrate. They can be for instance between about 20 and 100 or about 20 to 200 μm deep.

In certain embodiments, the etching of singulating trenches should be such that it can etch the back end of line, the front end of line and at least part of the substrate. Dielectrics such as $SiO_2$, low-K materials, and barrier layers can potentially be etched. The etched trenches are preferably as narrow as possible, for instance, down to about 20 μm or below. The minimum width is determined by the applied technology. For certain passivation layers a minimum width is necessary to allow the passivation layer to penetrate sufficiently deeply into the trenches to cover the sidewalls.

The step of reducing the thickness of the substrate from the bottom side of the stack can be for instance a polishing step as for instance a Chemical Mechanical Polishing (CMP) step, a grinding step or a substrate etch back. The final chip thickness is limited by the limitations of state of the art techniques. It can be for instance thinned up to about 200, 150, 130, 100, 90, 80, 70, 60, 50, 40, 30, 20, 10 μm in the range of about 10-200 μm or less.

Certain aspects of the present invention more particularly refer to the field of damascene processing; whereby subtractive etch steps are performed in a deposited layer, followed by deposition of a metal and a flattening (e.g. polishing) step, after which a new layer can be deposited. In such processing, typically metal (for instance copper) dummies (9) (FIG. 6) are processed at the same time with the processing of the BEOL, because of the well achievable uniformity after polishing during damascene processing. Damascene processing can be for instance Copper (Cu)-damascene, Aluminium (Al) damascene or Wolfram (W) Damascene. A special case of such damascene processing can be Cu/low-K applications.

Figure 6A:
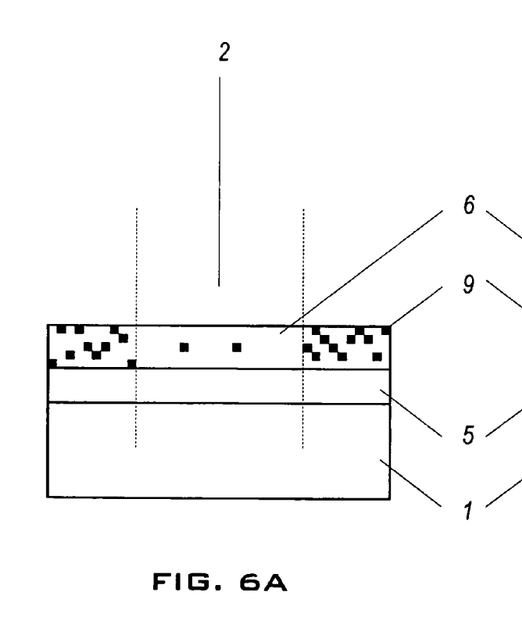
FIG. 6A represents a cross sectional view of a prior art embodiment
Figure 6B:
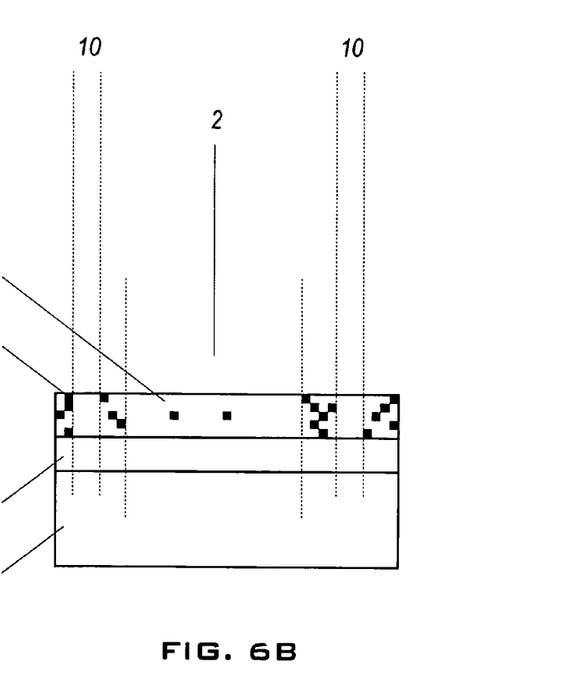
FIG. 6B represents an embodiment of the invention.
Figure 7A:
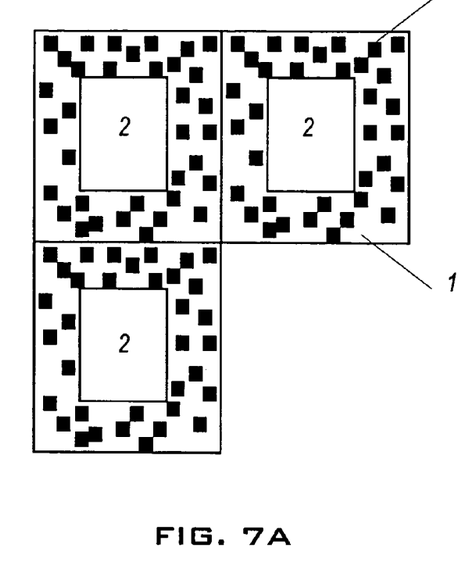
FIG. 7A and FIG. 7B represent top views of the matter depicted in FIG. 6A and FIG. 6B respectively.

In typical damascene processing, metal dummies are provided in the scribe lanes, such that they often cover the whole scribe lane area, when viewed upon from above (see FIG. 6A and FIG. 7A).

Figure 7B:
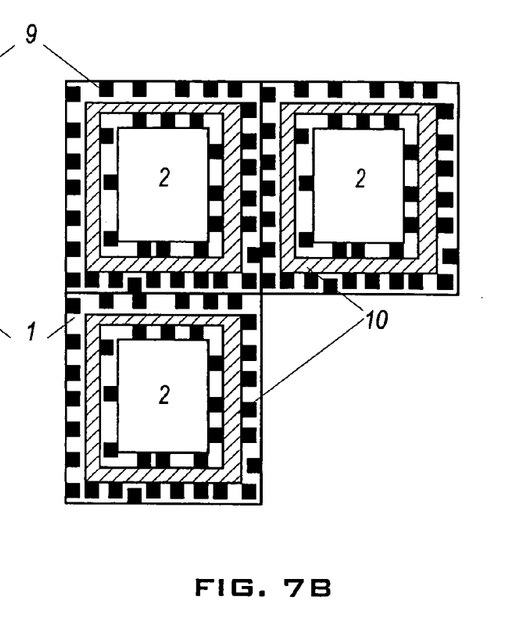

In certain embodiments, metal dummies are produced in the areas outside the area of the chip(s) during the BEOL processing. However, etching through metal is cumbersome. Therefore the metal dummies are positioned such that a metal exclusion zone (10) is foreseen, where no metal is present in any of the layers processed prior to etching the scribe lanes. The exclusion zone is placed around the chip area such that a line can be drawn in it that surrounds the chip area. In other words, it should enclose the chip area. The width of the exclusion zone may for instance, be about 15 μm. When looking or projecting from above, a trench area is left open, where no metal is present. The exclusion zone is used for etching the singulating trenches (see FIG. 6B, and FIG. 7B). The exclusion zone may be comprised in the scribe lanes between the die. The width of the singulating trenches, and thus the exclusion zone, can be smaller than the size of the copper dummies or smaller than a typical inter dummy distance. The metal exclusion zone enables trench etch dicing for damascene processing.

Figure 8:
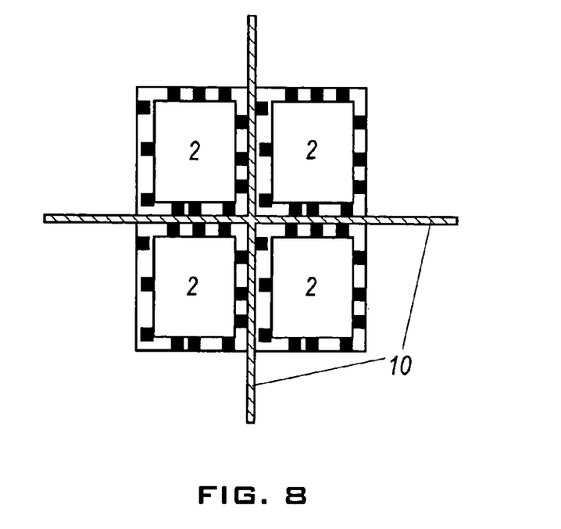
FIG. 8 depicts another type of exclusion zone.
Figure 9:
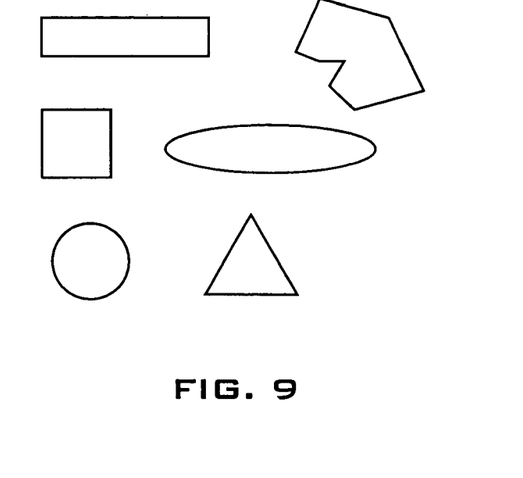
FIG. 9 depicts some more examples of exclusion zones.

FIG. 8 shows an alternative type of exclusion zone, whereby a lattice is formed between the chips. FIG. 9 shows some more examples of exclusion zones, which can correspond to similarly shaped chips. In principle, any form of exclusion zone and trench can be used.

Figure 10:
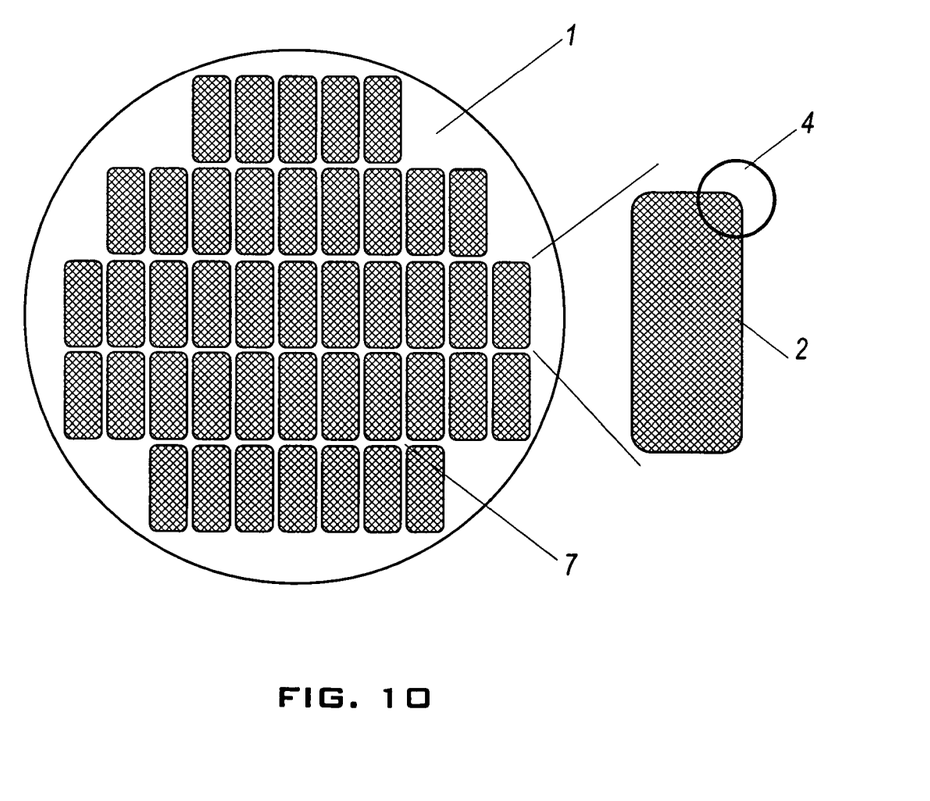
FIG. 10 depicts an embodiment of the invention, providing rounded vertical chip corner edges.

As a further advantage of the present invention, the step of providing singulating trenches can be chosen such that it produces rounded vertical chip corner edges (4) (FIG. 10). This can be achieved by performing the die singulation by exposing the wafer in a stepper or mask aligner with an image that defines the dicing streets and where, at crossover of different dicing streets, die corners are rounded. A mask with rounded die edges can be used for instance. This reduces the stress concentrations that occur near die corners (3) (see prior art FIG. 1, (3)). It is known by the person skilled in the art that alternative masks with other shapes can be used to achieve dies with rounded corners. This is especially relevant for thin die, which are particularly sensitive to such stresses. Square die corners, as present in state of the art methods, lead to stress pile up especially in thin dies (for instance between about 5 and 100 μm thick). Therefore, various embodiments of the invention provide for a reduction of stress sensitivity of the chips, resulting in a higher yield and reliability. This can be particularly advantageous for low-k applications.

Figure 11:
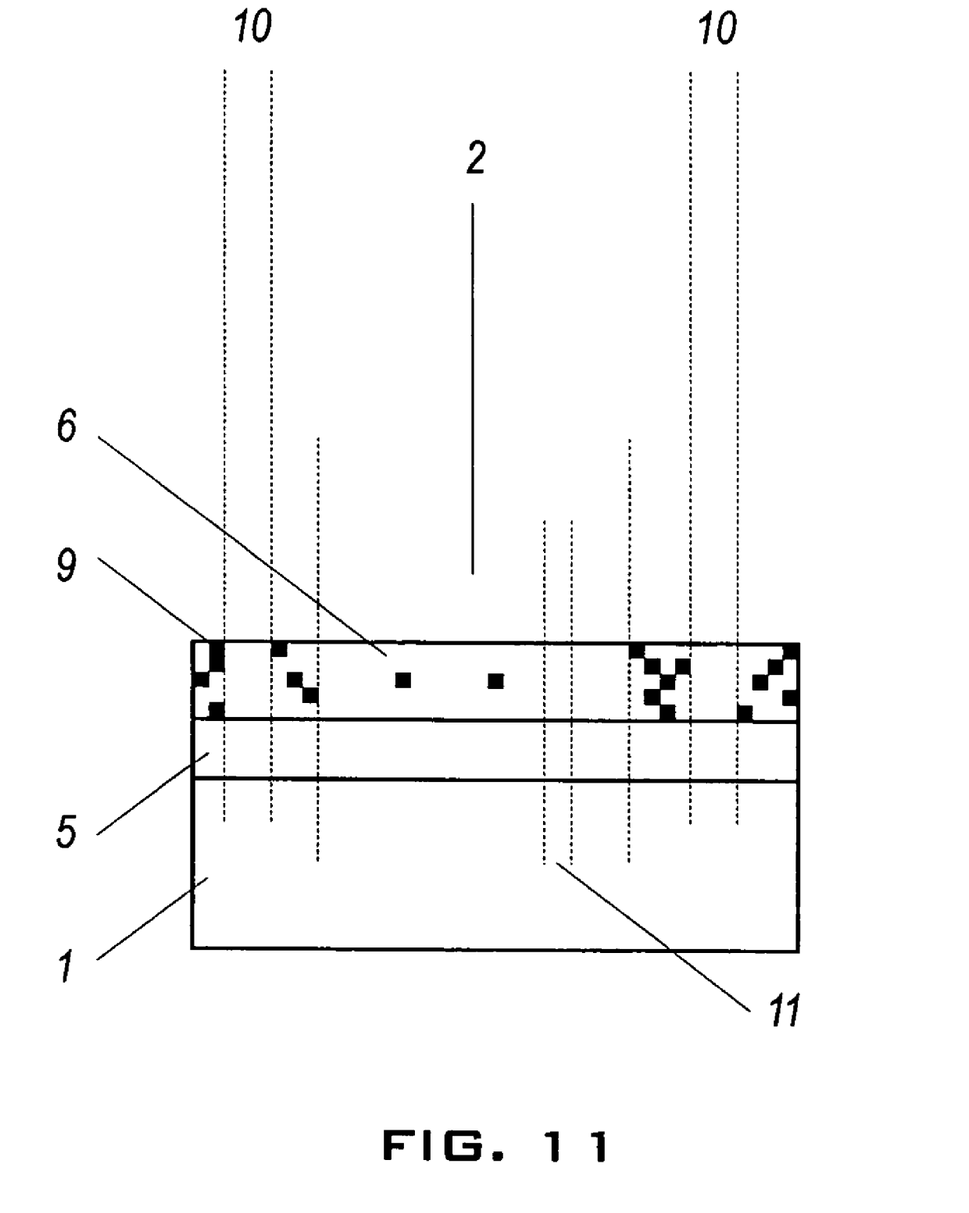
FIG. 11 represents an embodiment of the invention wherein, next to the etching of trenches aimed at chip singulation, additional features like holes are etched within the chip area.

In various embodiments (FIG. 11), the method according to invention can comprise a step wherein additional features, such as holes (11), are etched within the chip area. Such holes may also be trenches (not be confused with singulating trenches!), which for instance, but not only, can be part of a MEMS device or serve as an isolation trench. During the flattening step mentioned above, these holes can also be reached, thereby creating through holes. Such through holes can be used for instance for electrical or optical interconnections. This step can be performed together with the step of etching singulation trenches, i.e. using the same technology.

Other embodiments and modifications than those described above are also included within the scope of the invention which is defined below in the claims.

What is claimed is:

1. A method of singulating at least one chip from a stack of layers, the stack comprising a front end of line upon a substrate layer, the substrate layer having a first surface and a second surface, the front end of line being positioned on top of the first surface, and a back end of line on top of the front end of line, the method comprising:
   etching singulating trenches through the back end of line, through the front end of line and at least partially through the substrate layer of the stack;
   depositing a passivation layer on the stack provided with the etched singulating trenches, such that sidewalls of the trenches are at least partially passivated; and
   releasing the at least one chip from the stack of layers by reducing the thickness of the substrate layer from the second surface onwards to the bottom of the etched singulating trenches until the at least one chip is released from the stack.

2. The method as in claim 1, wherein etching the singulating trenches is performed using back end of line processing technology.

3. The method as in claim 1, wherein etching the singulating trenches further comprises:
   etching holes in the area of the at least one chip.

4. The method as in claim 1, further comprising:
   performing damascene processing for the back end of line.

5. The method as claim 1, wherein etching the singulating trenches further comprises:
   etching the singulating trenches using a mask with a pattern.

6. The method as in claim 5, wherein the pattern corresponds to dies with rounded corners.

7. The method as in claim 1, wherein the back end of line comprises moisture sensitive material.

8. The method as in claim 1, wherein the stack of layers further comprises a metallization layer between the front end of line and the back end of line.

9. The method as in claim 1, wherein the passivation layer comprises multiple sublayers.

10. The method as in claim 1, wherein the depositing is one of physical vapor depositing, chemical vapor depositing and spinning on.

11. The method as in claim 1, further comprising:
    attaching the stack of layers to an adhesive film or foil.

12. The method as in claim 1, wherein the substrate layer is one of a silicon substrate, a gallium arsenide substrate and a germanium substrate.

13. The method as in claim 1, wherein the reducing is one of chemical mechanical polishing, grinding and substrate etch backing.

14. A method of singulating at least one chip from a stack of layers, the stack comprising a front end of line upon a substrate layer, the substrate layer having a first surface and a second surface, the front end of line being positioned on top of the first surface, and a back end of line on top of the front end of line, the method comprising:
    positioning metal dummies in the back end of line, wherein the metal dummies are positioned outside a chip area and outside an exclusion zone, the exclusion zone surrounding the at least one chip; and
    etching singulating trenches through the back end of line, through the front end of line and at least partially through the substrate layer of the stack, wherein the etching is done in the exclusion zone and the singulating trenches surround the at least one chip.

15. The method as in claim 14, further comprising:
    depositing a passivation layer on the stack provided with the etched singulating trenches, such that sidewalls of the trenches are at least partially passivated.

16. The method as in claim 14, further comprising:
    releasing the at least one chip from the stack of layers.

17. The method as in claim 16, wherein the releasing comprises:
    reducing the thickness of the substrate layer from the second surface onwards to the bottom of the etched singulating trenches until the at least one chip is released from the stack.

18. The method as in claim 14, wherein etching the singulating trenches is performed using back end of line processing technology.

19. The method as in claim 14, wherein etching the singulating trenches further comprises:
    etching holes in the area of the at least one chip.

20. The method as in claim 17, further comprising:
    performing damascene processing for the back end of line.

21. The method as claim 14, wherein etching the singulating trenches further comprises:
    etching the singulating trenches using a mask with a pattern.

22. The method as in claim 21, wherein the pattern corresponds to dies with rounded corners.

23. The method as in claim 14, wherein the back end of line comprises moisture sensitive material.

24. The method as in claim 14, wherein the stack of layers further comprises a metallization layer between the front end of line and the back end of line.

25. The method as in claim 15, wherein the passivation layer comprises multiple sublayers.

26. The method as in claim 15, wherein the depositing is one of physical vapor depositing, chemical vapor depositing and spinning on.

27. The method as in claim 14, further comprising:
    attaching the stack of layers to an adhesive film or foil.

28. The method as in claim 14, wherein the substrate layer is one of a silicon substrate, a gallium arsenide substrate and a germanium substrate.

29. The method as in claim 17, wherein the reducing is one of chemical mechanical polishing, grinding and substrate etch backing.

30. The method of claim 1, comprising depositing the passivation layer on the stack provided with the etched singulating trenches, such that sidewalls of the front end of line and the back end of line are substantially passivated.

* * * * *